US007706312B1

(12) United States Patent
Lee (10) Patent No.: US 7,706,312 B1
(45) Date of Patent: Apr. 27, 2010

(54) DIGITAL SUB-CARRIER SIGNAL RECOVERY BASED ON PILOT ZERO-CROSSING

(75) Inventor: Chris Cheng-Chieh Lee, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 312 days.

(21) Appl. No.: 11/752,264

(22) Filed: May 22, 2007

Related U.S. Application Data (60) Provisional application No. 60/812,453, filed on Jun. 9, 2006, provisional application No. 60/815,461, filed on Jun. 21, 2006.

(51) Int. Cl.
*H04B 7/00* (2006.01)
(52) U.S. Cl. .................................. 370/310; 370/364
(58) Field of Classification Search ................ None
See application file for complete search history.

(56) References Cited

U.S. PATENT DOCUMENTS 3,982,075 A * 9/1976 Jefferis et al. .............. 370/324
4,101,834 A * 7/1978 Stutt et al. ................. 370/482
6,647,077 B1 * 11/2003 Shan et al. ................. 375/346
2003/0123408 A1 * 7/2003 Saitou ....................... 370/335
2006/0061684 A1 * 3/2006 Easley et al. ............... 348/485
2006/0222017 A1 * 10/2006 Quiroga et al. ............. 370/503

* cited by examiner

*Primary Examiner*—Chi H Pham
*Assistant Examiner*—Fan Ng (57) ABSTRACT

In an apparatus for generating a synchronized sub-carrier signal based on a pilot signal, a zero-crossing detector may detect a pilot signal zero-crossing in response to consecutive pilot signal samples. In response to the zero-crossing detector, a sub-carrier signal phase sampler generates a sequence of sub-carrier phase samples at a sampling frequency, inclining a first sub-carrier signal phase sample and additional sub-carrier signal phase samples at predetermined phase sample intervals. A phase sample counter counts the number of phase samples obtained by the sub-carrier signal phase sampler. A sub-carrier signal generator generates a synchronized sub-carrier signal in response to the sub-carrier signal phase samples. In response to the zero-crossing detector and the phase sample counter, a post-zero-crossing sub-carrier phase computation circuit outputs to the sub-carrier signal phase sampler an expected phase of a post-zero-crossing pilot signal phase sample in response to a premature pilot signal zero-crossing and an adjusted post-zero-crossing sub-carrier signal phase sample in response to a detected pilot signal zero crossing.

47 Claims, 7 Drawing Sheets

DIGITAL SUB-CARRIER SIGNAL RECOVERY BASED ON PILOT ZERO-CROSSING

CROSS REFERENCE TO RELATED APPLICATIONS

The present application claims the benefit of co-pending United States provisional application Ser. No. 60/812,453, filed on Jun. 9, 2006, and provisional application Ser. No. 60/815,461, filed on Jun. 21, 2006. The disclosures of both provisional applications are incorporated herein by reference in their entirety.

BACKGROUND OF THE INVENTION

1. Field of the Invention

This invention relates generally to synthesis of a sinusoidal signal that satisfies some specific frequency and phase conditions based on zero-crossings of a pilot signal, and more particularly to digital sub-carrier signal recovery that is often used in stereo Frequency Modulation (FM) receivers.

2. Description of the Related Art

A stereophonic multiplexed (MPX) signal is composed of a sum signal corresponding to the sum of the left and right audio channels, a pilot signal at 19 kHz, and a 38 kHz double-sideband suppressed-carrier (DSBSC) modulated signal of a difference signal corresponding to right channel subtracted from the left channel. The MPX signals are thereafter frequency modulated and transmitted. The pilot signal indicates to a FM receiver that there is stereophonic information at the second harmonic frequency of the pilot signal (i.e. twice the frequency of the pilot signal). A stereo FM receiver which receives the pilot signal may double the frequency of the pilot signal to demodulate the stereophonic information and obtain the left and right audio channels. The pilot signal may also aid the FM receiver in recovery of the sub-carrier signal by serving as a phase reference. Normally, if the recovered sub-carrier signal and the pilot signal are not synchronized in phase, the FM receiver may be unable to perfectly separate the left and right audio channels, resulting in interference with the channels and degradation of the left and right audio channel signals. Therefore, a need exists for a method and apparatus that generates a sub-carrier signal in phase with a pilot signal and maintains phase synchronization.

SUMMARY OF THE INVENTION

To address the stated need and fulfill other desired objectives, in accordance with one embodiment of the invention, a zero-crossing detector may detect a pilot signal zero-crossing in response to consecutive pilot signal samples. In response to the zero-crossing detector, a sub-carrier signal phase sampler generates a sequence of sub-carrier phase samples at a sampling frequency, including a first sub-carrier signal phase sample and additional sub-carrier signal phase samples at predetermined phase sample intervals. A phase sample counter counts the number of phase samples obtained by the sub-carrier signal phase sampler. A sub-carrier signal generator generates a synchronized sub-carrier signal in response to the sub-carrier signal phase samples. In response to the zero-crossing detector and the phase sample counter, a post-zero-crossing sub-carrier phase computation circuit may output to the sub-carrier signal phase sampler an expected phase of a post-zero-crossing pilot signal phase sample in response to a premature pilot signal zero-crossing and an adjusted post-zero-crossing sub-carrier signal phase sample in response to a detected pilot signal zero crossing.

DETAILED DESCRIPTION OF EMBODIMENTS

Figure 1:
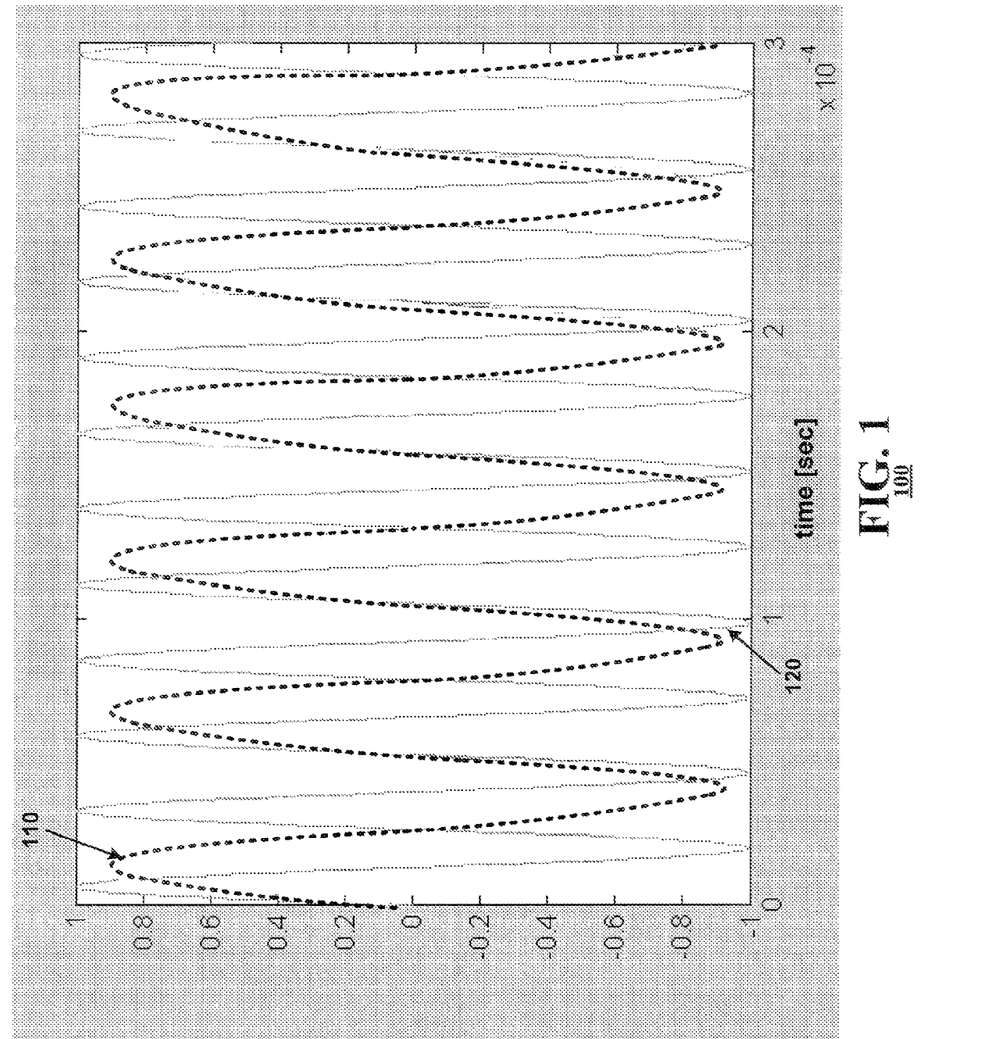
FIG. 1 is a graph of a pilot signal and a sub-carrier signal.

FIG. 1 illustrates a graph of one embodiment of a pilot signal and a sub-carrier signal. A pilot signal 110 is shown as a dashed line, while a sub-carrier signal 120 is shown as a solid line. The pilot signal 110 may have a first frequency, and the sub-carrier signal 120 may have a second frequency. The sub-carrier frequency may be a multiple of the pilot signal frequency. In one embodiment, the sub-carrier signal 120 may have a frequency equal to twice the frequency of the pilot signal 110.

The sub-carrier signal 120 may be synchronized with the pilot signal 110. Synchronization may refer to the sub-carrier signal 120 being in phase with the pilot signal 110. Synchronization is exhibited by the sub-carrier signal 120 crossing the time axis (x-axis) of the graph in FIG. 1 when the pilot signal 110 crosses the time axis. Synchronization may be further enhanced if the sub-carrier signal 120 is generated such that when the pilot signal 110 crosses the time axis the sub-carrier signal 120 crosses the time axis from negative to positive.

Figure 2:
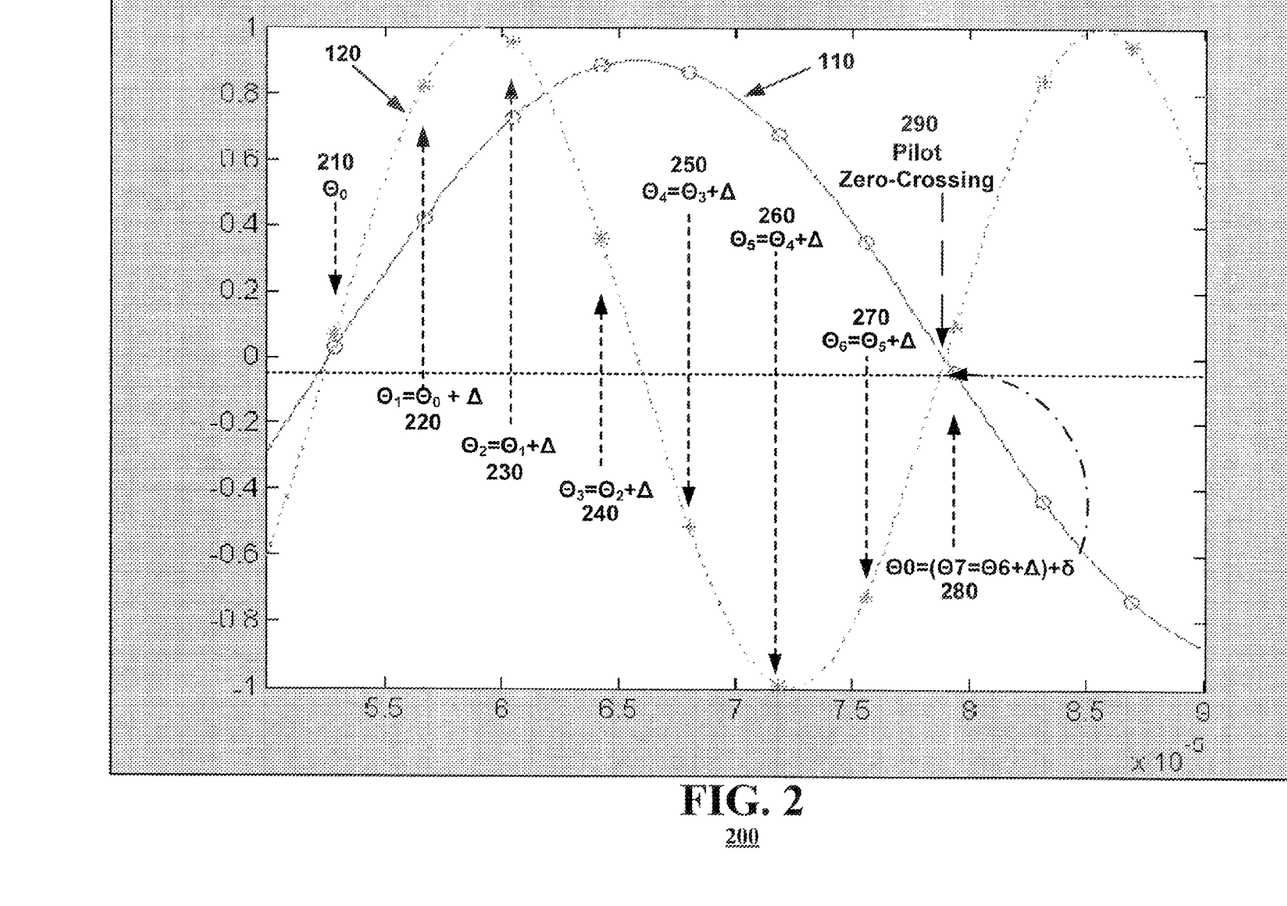
FIG. 2 is a graph of the phase of a pilot signal and a sub-carrier signal which shows samples of the sub-carrier signal generated over predetermined intervals.

FIG. 2 is a graph of the phase of a pilot signal and a sub-carrier signal which shows samples 210-280 of the sub-carrier signal 120 generated over predetermined intervals, based on a predetermined sampling frequency, and as part of the sub-carrier signal generation process. The sequence of samples may be generated immediately following a pilot signal zero-crossing. Using the phrase of the sub-carrier signal sample, a sub-carrier signal may be generated. The sub-carrier signal generated may be sinusoidal.

In FIG. 2, $\Theta_0$ 210 may depict a first phase sample of the recovered sub-carrier signal generated based on the pilot signal 110 following a pilot signal zero-crossing. Subsequent samples 220-280 of the sub-carrier signal may be generated using the formula:

$$\Theta_{n+1} = \Theta_n + \Delta,$$

where $\Delta$ is a constant value dependent on the frequency of the sub-carrier signal and the sampling frequency, and may be expressed as:

$$\Delta = (2\Pi f_{sub})/f_s,$$

where $f_{sub}$ is the frequency of the sub-carrier signal, and $f_s$ is the predetermined sampling frequency. The formula disclosed above for obtaining samples of the sub-carrier signal 120 may be used so long as a pilot signal zero-crossing does not occur. In one embodiment, for a 19 kHz pilot signal, a 38 kHz sub-carrier signal, and a 264.6 kHz sampling frequency, six samples may be generated be ore the next pilot signal zero-crossing.

In the event of a pilot signal zero-crossing 290, the phase of the sub-carrier signal 120 may become de-synchronized from the phase of the pilot signal 110. In this ease, the sampling formula $\Theta_{n+1} = \Theta_n + \Delta$ may require modification to account for the pilot signal zero-crossing crossing 290. These modifications generally may be embodied by the $\delta$ variable seen in FIG. 2 shown at sample 280. As shown in FIG. 2, sample 280 is the adjusted first post-pilot signal zero-crossing sub-carrier signal phase sample.

Figure 3:
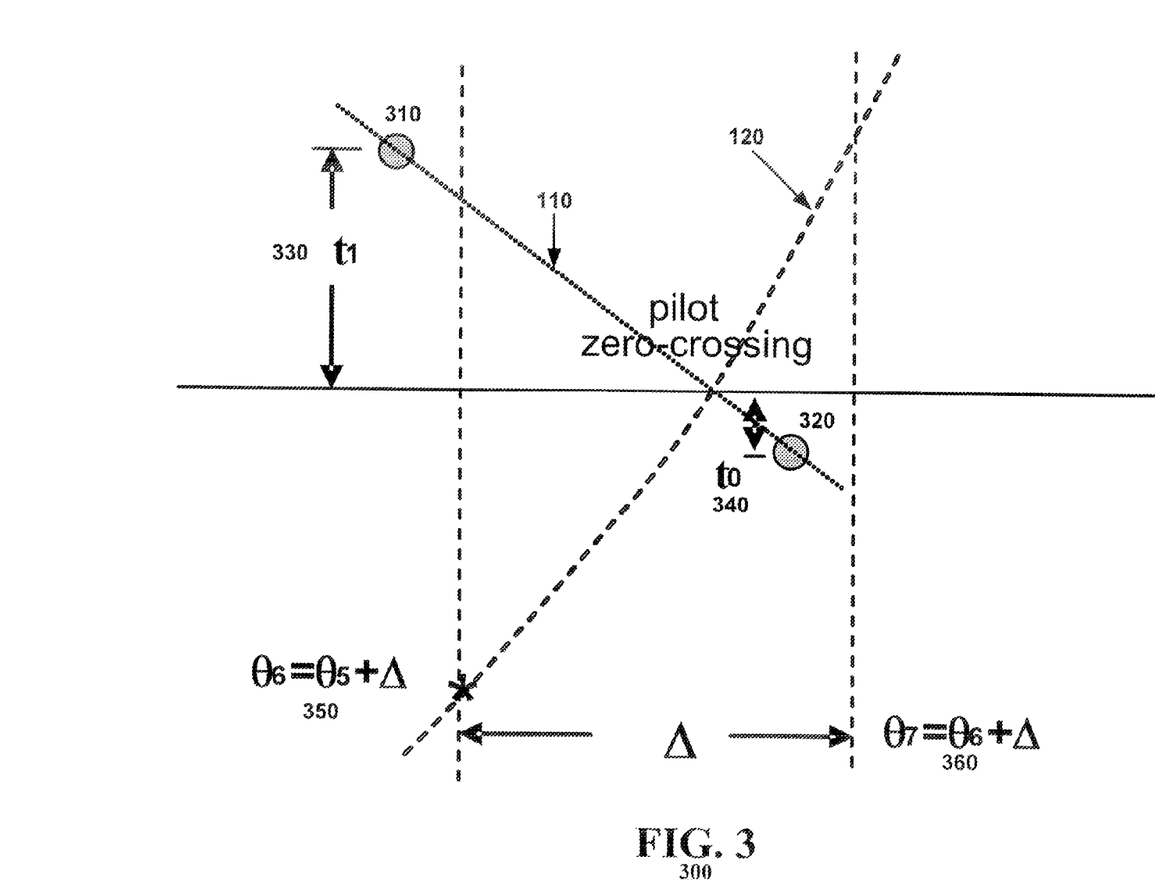
FIG. 3 illustrates one embodiment for maintaining synchronicity of the sub-carrier signal as compared to the pilot signal in response to a pilot signal zero-crossing.

FIG. 3 illustrates one embodiment for maintaining synchronicity of the sub-carrier signal and the pilot signal in response to a pilot signal zero-crossing. As discussed above, a pilot signal zero-crossing may affect the synchronization of the sub-carrier and pilot signal phases. To compensate of adjust the sub-carrier signal 120 in response to a pilot signal zero-crossing, the phase of the first post-zero-crossing pilot signal sample 320 may be approximated using the formula:

$$(t_0 * \Delta)/(t_0 + t_1),$$

where $t_0$ 340 may represent the amplitude of the first pilot signal sample following the zero-crossing, and $t_1$ 330 may represent the amplitude of the last pilot signal sample preceding the zero-crossing, as shown in FIG. 3.

The phase sample $\Theta_0$, shown in FIG. 2 as the first post-zero-crossing sub-carrier signal sample 280, may be obtained by adjusting the unadjusted post-zero-crossing, sub-carrier signal sample $\Theta_7$ 360 in response to the zero-crossing using the above-mentioned pilot signal phase approximation formula and an adaptation value $\mu$. The adaptation value $\mu$ may be a variable. In one embodiment, the adaptation value $\mu$ may be a constant. The adjustment may result in the sub-carrier signal 120 moving toward the pilot signal zero-crossing. Adjusted for the pilot sample zero-crossing, the phase sample $\Theta_0$ 280 may be calculated using the formula:

$$\Theta_0 = \Theta_7 + \mu * [((t_0 * \Delta)/(t_0 + t_1)) - \Theta_7].$$

This formula may have the effect of moving the sub-carrier signal 120 toward the pilot signal zero-crossing.

Alternatively, the phase sample $\Theta_0$ may be calculated using the same formula above by adjusting the unadjusted post-zero-crossing sub-carrier signal sample $\Theta_7$ using the aforementioned pilot signal phase approximation formula and a variable adaptation value $\mu$. During the adjustment the variable adaptation value $\mu$ initially may have a larger value to increase the speed of adjustment. In one embodiment, the adaptation value $\mu$ initially may have a value of 0.10 to increase the adjustment speed. As the adjusted phase sample $\Theta_0$ nears the pilot signal zero-crossing, the adaptation value $\mu$ may decrease in value to provide a more accurate adjustment. In one embodiment, the adaptation value it may decrease to a value of 0.01 to increase the sensitivity and accuracy of the adjustment.

Figure 4:
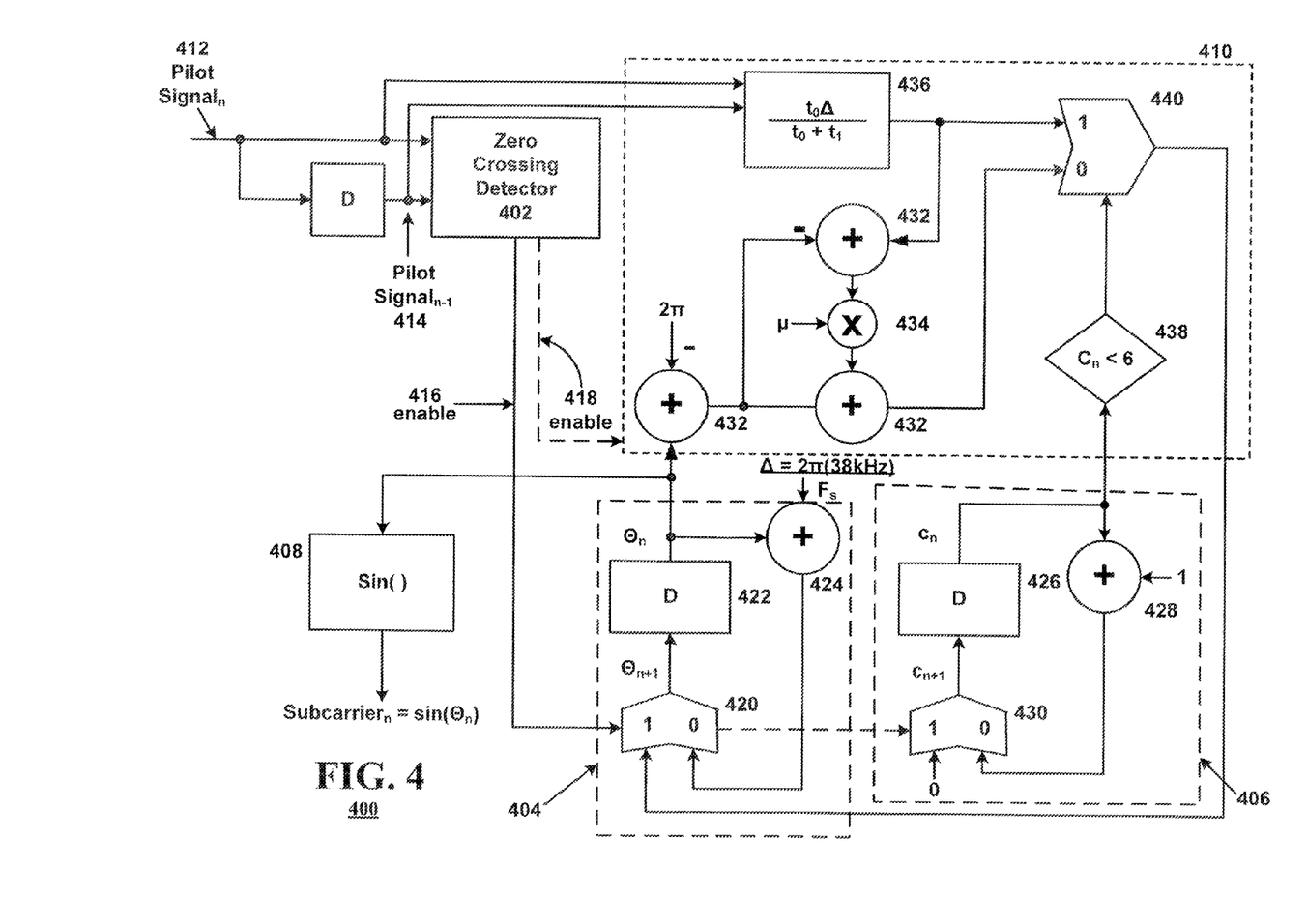
FIG. 4 is a block diagram illustrating one embodiment for sampling the phase of a sub-carrier signal, generating a sub-carrier signal based on the phase of the pilot signal, and adjusting the sub-carrier signal in response to a pilot signal zero-crossing.

FIG. 4 is a block diagram illustrating one embodiment for sampling the phase of a sub-carrier signal, generating a sub-carrier signal based on the sub-carrier signal phase sample, and adjusting the sub-carrier signal in response to a pilot signal zero-crossing. The sub-carrier recovery system may include a zero-crossing detector 402, a sub-carrier signal phase sampler 404, a phase sample counter 406, a sub-carrier signal generator 408, and a post-zero-crossing sub-carrier phase computation circuit 410.

The zero-crossing detector 402 may detect the occurrence of a pilot signal zero-crossing. The zero-crossing detector may receive two consecutive samples of the pilot signal 412, 414 and may compare the signs of the values of the samples 412, 414. Two samples having inconsistent signs (i.e. a positive amplitude value and a negative amplitude value, etc.) may indicate that a pilot signal zero-crossing has occurred. The zero-crossing detector 402 may provide two enable signals 416, 418 based on the comparison to enable other components of the sub-carrier recovery system upon the occurrence or non-occurrence of a zero-crossing.

The sub-carrier signal phase sampler 404 may generate sub-carrier phase samples at a predetermined sampling frequency, based on the pilot signal. The sub-carrier signal phase sampler 404 may receive a first enable signal 416 from the zero-crossing detector 402. In response to the first enable signal 416, the phase sampler 404 may generate either the output of the post-zero-crossing sub-carrier phase computation circuit 410 or a sample $\Theta_{n+1}$ using the previous sample $\Theta_n$ added to a constant $\Delta$, where $\Delta = (2\Pi * f_{sub})/f_s$, and where $f_{sub}$ may represent the frequency of the sub-carrier signal and $f_s$ may represent the sampling frequency. The phase sample 404 may include a selector 420, such as a switch, to output either the $\Theta_{n+1}$ sample or the output of the post-zero-crossing sub-carrier phase computation circuit; a memory or delay 422 to retain the previous $\Theta_n$ sample; and an adder 424 to add a predetermined interval $\Delta$ to the $\Theta_n$ sample to obtain the $\Theta_{n+1}$ sample.

The phase sample counter 406 may count the number of samples generated by the phase sampler 404. The phase sample counter 406 may receive the first enable signal 416 provided by the zero-crossing, detector 402. The phase sample counter 406 may include a phase sample counter memory or delay 426 to store the count of the number of phase samples obtained, or $c_n$; an adder 428 to add one to the count for each additional sample generated; and a selector 430, such as a switch, to select the sum of $c_n+1$ or to reset the counter to zero.

The sub-carrier signal generator 408 may receive each phase sample $\Theta_n$ generated by the phase sampler 404 and generate a sub-carrier signal in phase with the pilot signal. In one embodiment, the sub-carrier signal generator 408 may generate a sub-carrier signal that is sinusoidal. An exemplary embodiment of a sub-carrier signal generator may be a signal generator employing the Coordinate Rotation Digital Computer (CORDIC) algorithm.

The post-zero-crossing sub-carrier phase computation circuit 410 may adjust the sub-carrier signal response to a pilot signal zero-crossing to maintain synchronicity between the pilot signal and the sub-carrier signal. Upon the detection of a pilot signal zero-crossing, the zero-crossing detector 402 may output a second enable signal 418 to the post-zero-crossing sub-carrier signal phase computation circuit 410. The post-zero-crossing sub-carrier phase computation circuit 410 may also receive the two consecutive memory samples of the pilot signal 412, 414 originally received by the zero-crossing detector 402, the phase sample $\Theta_n$ obtained by the phase sampler 404, and the phase sample count $c_n$ maintained by the phase sample counter 406. The phase computation circuit may include multiple adders 432, a multiplier 434, a pilot signal phase calculator 436, a selector 440, such as a switch, and a count comparator 438. The recovery circuit 410 may output an adjusted sub-carrier signal phase sample or an approximated post-zero-crossing pilot signal phase to the sub-carrier signal phase sampler 404 depending on the count comparator 438.

The pilot signal phase calculator 436 may receive the two consecutive memory samples of the pilot signal 412, 414 as inputs and approximate the phase of the first post-zero-crossing pilot signal sample. In one embodiment, the pilot signal phase calculator 436 may approximate the phase of the first post-zero-crossing pilot signal sample using the formula $$(t_0 * \Delta)/(t_0 + t_1),$$

where $t_0$ may represent the amplitude of the first pilot signal sample following the zero-crossing, and $t_1$ may represent the amplitude of the last pilot signal sample preceding the zero-crossing, as shown in FIG. 3. The adders 432 and multiplier 434 may be employed to replicate in hardware the equation described above in paragraph [0017] for adjusting the first sub-carrier phase sample, $\Theta_0$, after the zero-crossing in response to the pilot signal zero-crossing. The count comparator 438 may compare the existing phase sample count received by the phase computation circuit 410 from the phase sample counter 406 to an expected number of phase samples to determine whether an expected pilot signal zero-crossing has occurred. Due to noise and other interference, the zero-crossing detector 402 may occasionally detect a false pilot signal zero-crossing. The count comparator 438 may thus use the sampling frequency and the sub-carrier signal frequency to determine how many phase samples should be obtained before a zero-crossing occurs. If the count comparator 438 detects a false zero-crossing, the count may be reset in the phase sample counter 406, and the output of the pilot phase calculator 436 may be selected by the selector 440 as the output of the phase computation circuit 410. This output may be received by the sub-carrier signal phase sampler 404 as the phase sample upon which to output to the sub-carrier signal generator 408. If the count evaluator 438 detects an expected pilot signal zero-crossing, the count may be reset in the phase sample counter 406 and the adjusted phase of first post-zero-crossing sub-carrier signal phase sample, $\Theta_0$, may be selected by the switch 440 as the output to the sub-carrier signal phase sampler 404.

Figure 5:
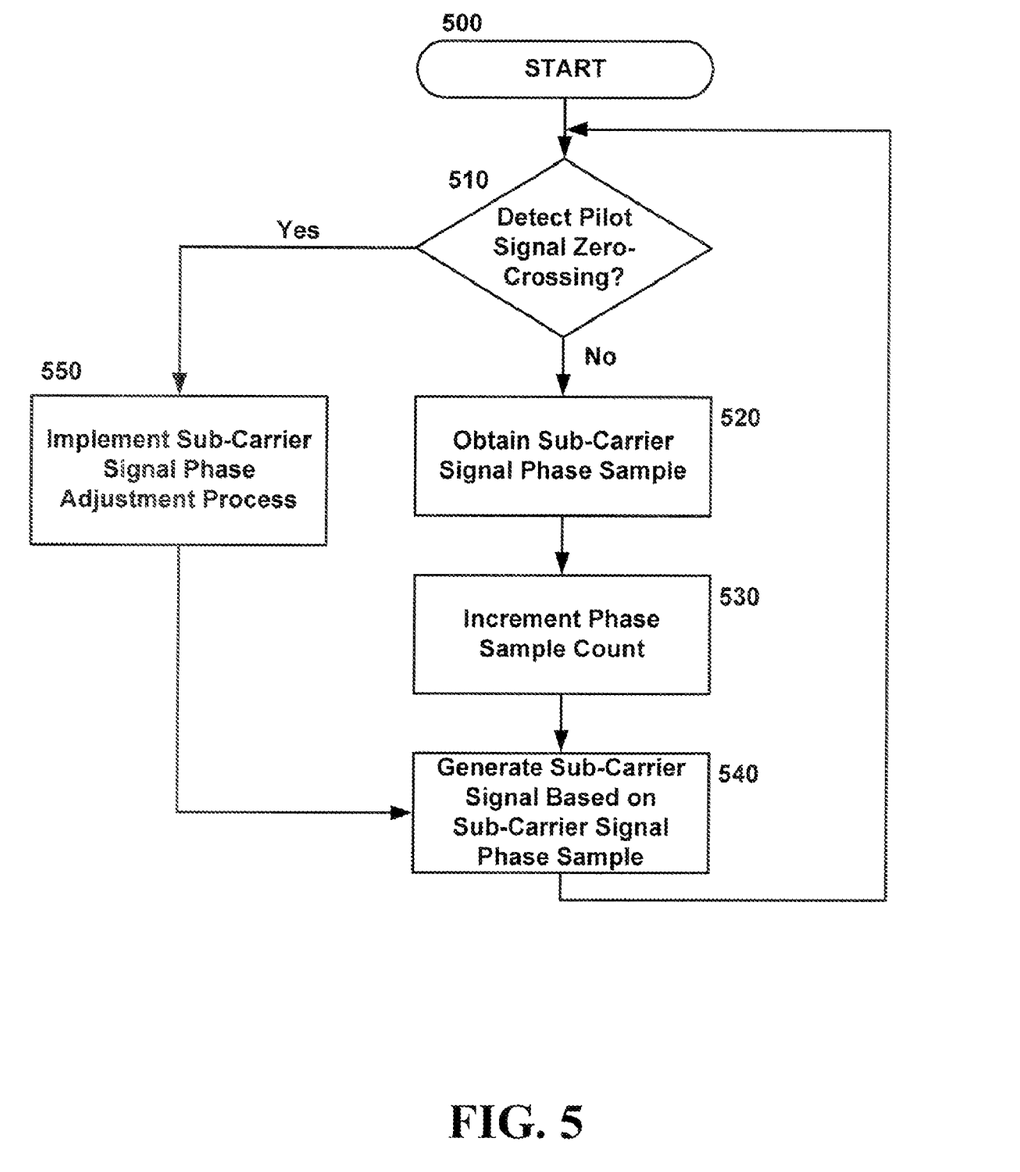
FIG. 5 is a flowchart illustrating one embodiment for generating a synchronized sub-carrier signal based on a pilot signal.

FIG. 5 is a flowchart illustrating one embodiment for generating a synchronized sub-carrier signal based on a pilot signal. In block 510, a zero-crossing detector receive two consecutive memory samples of a pilot signal of a first frequency and detect whether a pilot signal zero-crossing has occurred. The zero-crossing detector may compare the signs of the values of the two pilot signal samples to determine whether a zero-crossing has occurred (i.e. a positive sign to a negative sign etc.). In block 520, if a zero-crossing is not detected, a sub-carrier signal phase sample may be generated. In block 530, a phase sample counter may be incremented to reflect that a sub-carrier signal phase sample was generated. In block 540, a sub-carrier signal of a second frequency may be generated in synchronous phase with the pilot signal using the sub-carrier signal phase sample. Following generation of a sub-carrier signal, the sequence may repeat again. If a zero-crossing is detected in block 510, then in block 550, a sub-carrier signal phase adjustment process may be undertaken. Following the completion of the adjustment process, in block 540, the sub-carrier signal of the second frequency may be generated in synchronous phase with the pilot signal using the post-zero-crossing sub-carrier signal phase sample generated in block 550. The sequence may repeat again following generation of a synchronous sub-carrier signal based on the post-zero-crossing sub-carrier signals phase sample.

Figure 6:
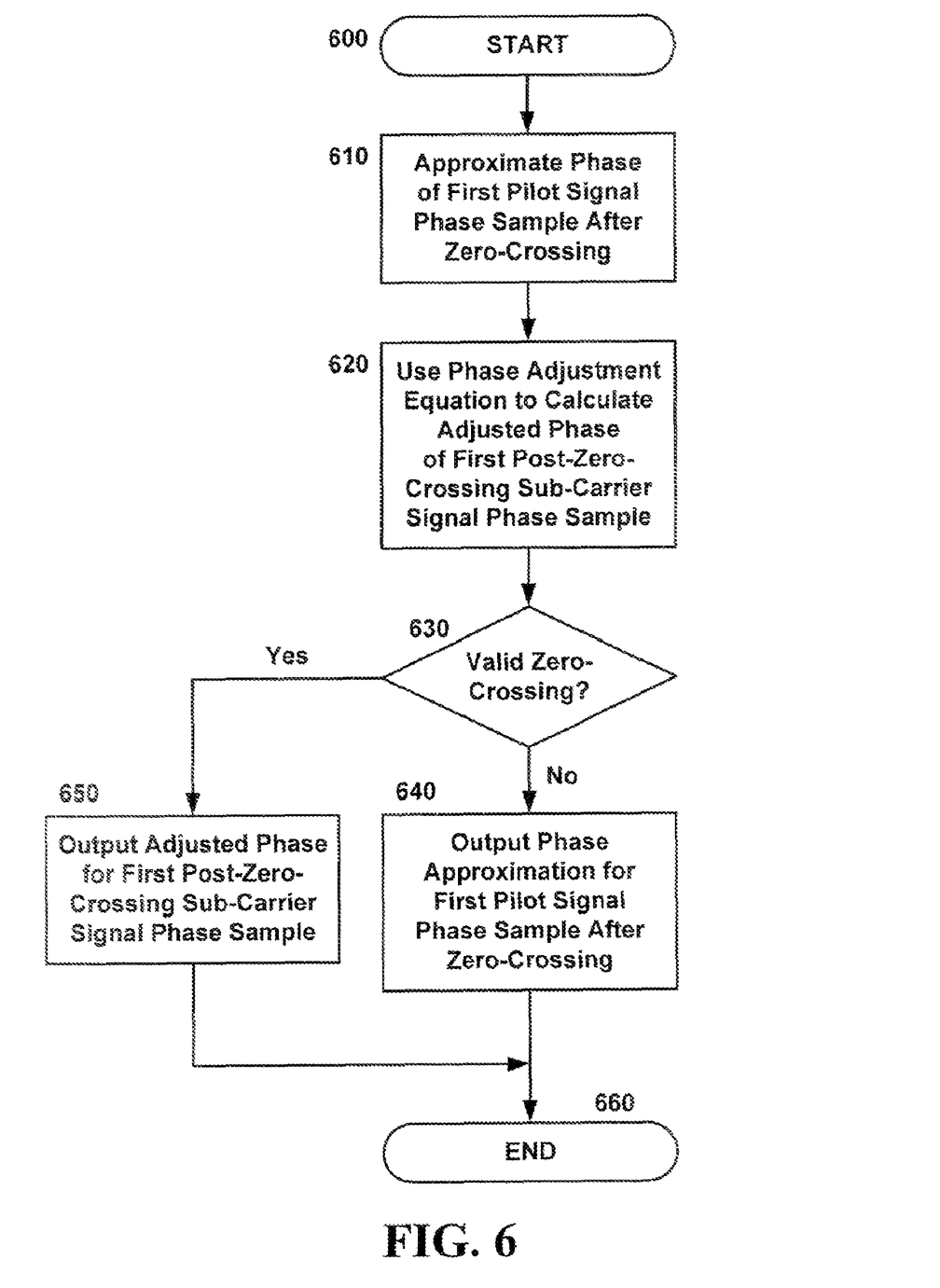
FIG. 6 is a flowchart illustrating one embodiment for maintaining synchronicity of a sub-carrier signal and a pilot signal upon the occurrence of a pilot signal zero-crossing.

FIG. 6 is a flowchart illustrating one embodiment for maintaining synchronicity of a sub-carrier signal and a pilot signal upon the occurrence of a pilot signal zero-crossing. If a pilot signal zero-crossing occurs, in block 610, the phase of the first post-zero-crossing pilot signal phase sample may be approximated. The phase of this sample may be calculated using the equation:

$$(t_0 * \Delta)/(t_0 + t_1),$$

where, in accordance with FIG. 3, $t_0$ may represent the amplitude of the pilot signal phase sample obtained after the zero-crossing, $t_1$ may represent the amplitude of the last pilot signal phase sample obtained before the zero-crossing, and $\Delta$ may represent a constant value determined by the equation, $$\Delta = 2\Pi * f_{sub}/f_S,$$

where $f_{sub}$ may represent the frequency of the sub-carrier signal, and $f_S$ may represent the sampling frequency. In block 620, the phase of the first post-zero-crossing sub-carrier signal phase sample may be adjusted using a phase adjustment equation. For an embodiment with a 19 kHz pilot signal, a 38 kHz sub-carrier signal, and a 264.6 kHz sampling frequency, the phase adjustment equation may be represented as:

$$\Theta_0 = \Theta_7 + \mu * [((t_0 * \Delta)/(t_0 + t_1)) - \Theta_7],$$

where $\Theta_7$ may represent the unadjusted post-zero-crossing sub-carrier signal phase sample.

Figure 7:
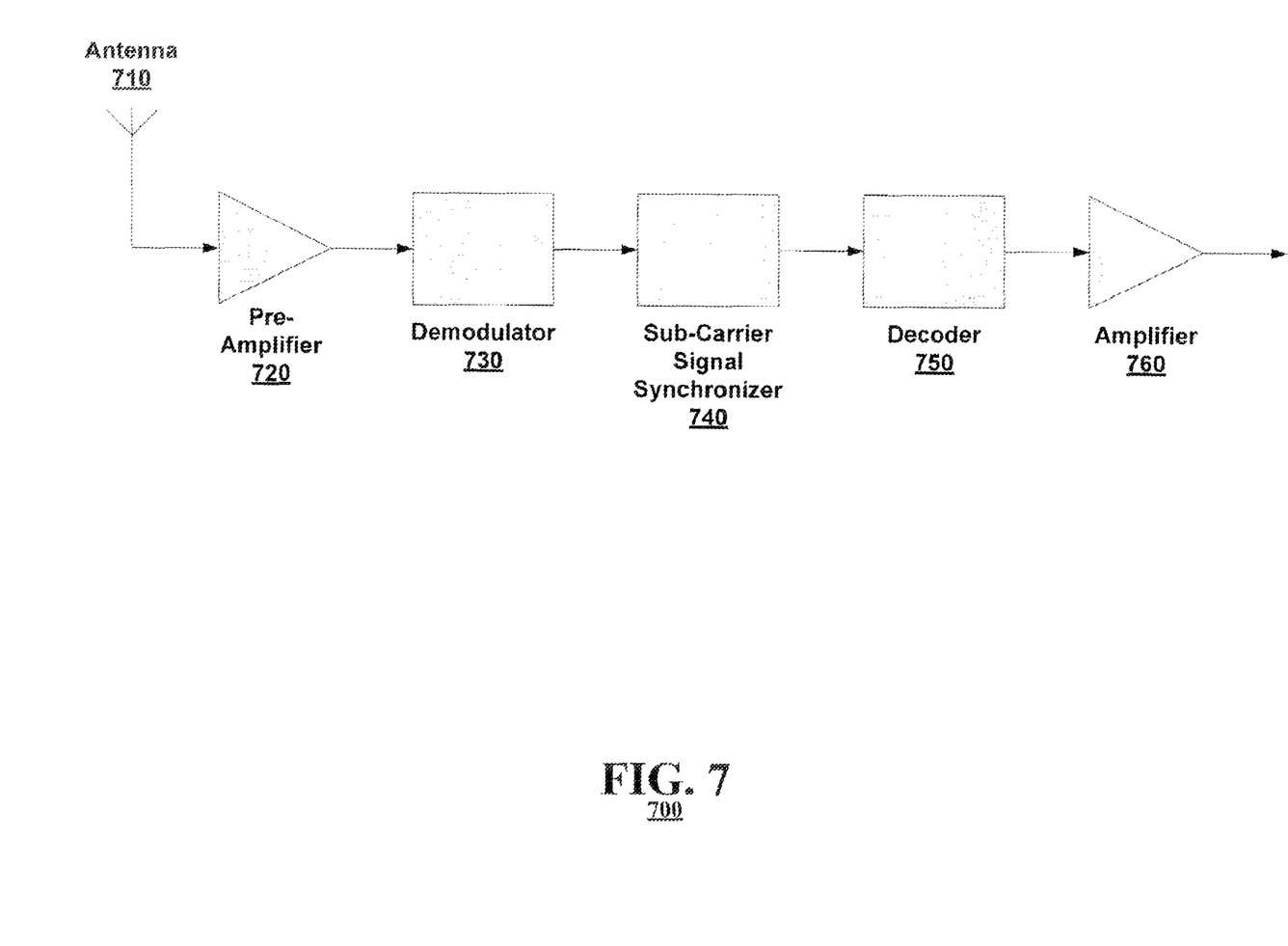
FIG. 7 is a block diagram illustrating one embodiment of a FM receiver incorporating an apparatus for synchronizing a sub-carrier signal to a pilot signal.

In block 630, the zero-crossing may be evaluated to determine its validity. The validity of the zero-crossing may be determined by comparing the phase sample count, which indicates the number of phase samples generated since the previous zero-crossing, to an expected number of phrase samples which is dependent on the sub-carrier signal frequency and the sampling frequency. For example, given a 38 kHz sub-carrier signal frequency and a 264.6 kHz sampling frequency, six phase samples are expected to be generated before a zero-crossing is to occur. If a zero-crossing is detected and the phase sample count does not equal six, then the zero-crossing is premature and not valid. In the event that the zero-crossing is invalid, then the phase approximation for the first post-zero-crossing pilot signal phase sample may be used as a phase sample for which to generate a corresponding synchronized sub-carrier signal. If a zero-crossing is detected and the phase sample count equals six, then the zero-crossing is valid. For a valid zero-crossing, an adjusted sub-carrier signal phase sample based on the equation described above may be used to generate a sub-carrier signal synchronized with the pilot signal FIG. 7 is a block diagram of one embodiment of a FM receiver incorporating an apparatus for synchronizing a sub-carrier signal to a pilot signal. The FM receiver may include an antenna 710 which receives a FM stereo signal having a pilot signal at a first frequency and a suppressed sub-carrier signal at a second frequency. The FM signal may be amplified by a pre-amplifier 720 for further processing by the FM receiver. A demodulator 730 may demodulate the pre-amplified FM signal to extract modulated audio data. The demodulated signal may be processed by embodiments of the apparatus described above to generate a sub-carrier signal synchronized with the pilot signal. For stereo FM signals, the sub-carrier signal may include left and right audio channel data. Once synchronized, the FM signal may be decoded by a decoder 740 into its component parts, such as right and left audio channels. The decoded signal may be amplified by an amplifier 750. which in some embodiments may be a power amplifier. The amplified may be output to a speaker (not shown). The above FM receiver embodiment is intended to illustrate one embodiment for incorporating the synchronization apparatus described above into a FM receiver. One skilled in the art will recognize that other components may be included or used in a FM receiver to process a received FM signal, and that the placement or coupling of the synchronization apparatus to other components may differ for different FM receivers.

Embodiments of the invention described above may be used in or incorporated into fields and devices including, but not limited to, communications systems employing transmission of information through multiplexed signals, such as FM broadcasting and other analog radio mediums and television signals, and other systems where it is desirable to generate and maintain a sub-carrier signal synchronized to a main transmission or pilot signal. For example, embodiments of the invention described above may be used to synchronize a sub-carrier signal with a pilot signal in a FM stereo receiver.

In addition to these exemplary embodiments, those skilled in the art will recognize that numerous applications of the above-described embodiments are possible, and that disclosure of the just-described applications does not limit the invention to these applications. Rather, all suitable applications fall within the scope of the invention. Therefore, the foregoing is illustrative only of the principles of the invention. Further, those skilled in the art will recognize that numerous modifications and changes are possible, the disclosure of the just-described embodiments does not limit the invention to the exact construction and operation shown, and accordingly, all suitable modifications and equivalents fall within the scope of the invention.

What is claimed is:

1. An apparatus to generate a synchronized sub-carrier signal based on a pilot signal, the apparatus comprising:
    a zero-crossing detector, responsive to said pilot signal, for detecting a pilot signal zero-crossing based on said pilot signal;
    a sub-carrier signal phase sampler, responsive to said zero-crossing detector, for generating a sequence of sub-carrier signal phase samples at a sampling frequency, said sequence of sub-carrier signal phase samples comprising a first sub-carrier signal phase sample and additional sub-carrier signal phase samples at predetermined phase sample intervals;
    a phase sample counter for counting said phase samples generated by said sub-carrier signal phase sampler;
    a sub-carrier signal generator, responsive to said sub-carrier signal phase samples, for generating said synchronized sub-carrier signal; and
    a post-zero-crossing sub-carrier phase computation circuit, responsive to said zero-crossing detector, said sub-carrier signal phase sampler, and said phase sample counter, for outputting to said sub-carrier signal phase sampler an expected phase of a post-zero-crossing pilot signal phase sample in response to a premature pilot signal zero-crossing and an adjusted post-zero-crossing sub-carrier signal phase sample in response to said detected pilot signal zero-crossing.

2. The apparatus of claim 1, wherein said sub-carrier signal phase sampler comprises:
    a phase sample memory to store said sub-carrier signal phase sample;
    an adder to add said predetermined phase sample interval to said sub-carrier signal phase sample to generate a sequential sub-carrier signal phase sample; and
    a phase sample selector to select said sequential sub-carrier signal phase sample or said expected phase of said post-zero-crossing pilot signal phase sample based on a first enable signal output from said zero-crossing detector.

3. The apparatus of claim 1, wherein said post-zero-crossing sub-carrier phase computation circuit comprises:
    a phase calculator, responsive to consecutive pilot signal phase samples, to calculate said expected phase of said post-zero-crossing pilot signal phase sample;
    a plurality of adders and a multiplier to operate on said sub-carrier signal phase sample, said expected phase of said post-zero-crossing pilot signal sample, and an adaptation value to generate said adjusted post-zero-crossing sub-carrier signal phase sample;
    a comparator to compare said phase sample count to a predetermined threshold; and
    a selector to select either said expected phase of said post-zero-crossing pilot signal phase sample or said adjusted post-zero-crossing sub-carrier signal phase sample based on said comparator output.

4. The apparatus of claim 1, wherein said sub-carrier signal has a first frequency and said pilot signal has a second frequency.

5. The apparatus of claim 4, wherein said first frequency is a multiple of said second frequency.

6. The apparatus of claim 5, wherein said first frequency is twice said second frequency.

7. The apparatus of claim 4, wherein said premature pilot signal zero-crossing occurs if a number of phase samples counted by said phase sample counter is less than a quotient of said sampling frequency divided by said first frequency.

8. The apparatus of claim 4, wherein said predetermined phase sample interval is proportional to a ratio of said first frequency to said sampling frequency.

9. The apparatus of claim 1, wherein said zero-crossing detector detects said pilot signal zero-crossing by monitoring consecutive pilot signal phase samples for a change in signs of values of a first consecutive pilot signal phase sample and a second consecutive pilot signal phase sample.

10. The apparatus of claim 1, wherein said zero-crossing detector outputs a first enable signal to said sub-carrier signal phase sampler and said phase sample counter if said pilot signal zero-crossing is not detected.

11. The apparatus of claim 1, wherein upon detection of said pilot signal zero-crossing, said zero-crossing detector provides a first enable signal to said sub-carrier signal phase sampler and said phase sample counter and a second enable signal to a sub-carrier recovery circuit.

12. The apparatus of claim 1, wherein said first sub-carrier signal phase sample is generated by said sub-carrier signal phase sampler in response to said pilot signal zero-crossing.

13. The apparatus of claim 1, wherein said sub-carrier signal phase sampler, responsive to said pilot signal zero-crossing or said premature pilot signal zero-crossing, ceases generating said sequence of sub-carrier signal phase samples and restarts said sequence by re-generating said first sub-carrier signal phase sample.

14. The apparatus of claim 1, wherein said phase sample counter resets to zero if said pilot signal zero-crossing is detected or if said premature pilot signal zero-crossing is detected.

15. The apparatus of claim 1, wherein said synchronized sub-carrier signal is sinusoidal.

16. The apparatus of claim 1, wherein said expected phase of said post-zero-crossing pilot signal phase sample is calculated based on said consecutive pilot signal samples and said predetermined phase sample interval.

17. The apparatus of claim 16, wherein said adjusted post-zero-crossing sub-carrier signal phase sample is calculated based on said expected phase of said post-zero-crossing pilot signal phase sample, an adaptation value, and a pre-zero-crossing sub-carrier signal phase sample, wherein said pre-zero-crossing sub-carrier signal phase sample is a last sub-carrier signal phase sample obtained before said detected pilot signal zero-crossing.

18. The apparatus of claim 17, wherein said adjusted post-zero-crossing sub-carrier signal phase sample is a sum of an unadjusted first post-zero-crossing sub-carrier signal phase sample and a product of said adaptation value multiplied by a difference of said expected phase of said post-zero-crossing pilot signal phase sample and said unadjusted first post-zero-crossing sub-carrier signal phase sample.

19. The apparatus of claim 17, wherein said adaptation value is variable during said calculation of said adjusted post-zero-crossing sub-carrier signal phase sample.

20. A FM stereo receiver, comprising:
an antenna to receive a FM signal, said FM signal including a pilot signal and a suppressed sub-carrier signal;
a pre-amplifier to amplify said received FM signal;
a demodulator to demodulate said amplified FM signal;
an apparatus according to claim 1 to synchronize said suppressed sub-carrier signal with said pilot signal;
a decoder to decode said synchronized sub-carrier signal into left and right audio channels; and
an amplifier to amplify said left and right audio channels.

21. The FM receiver of claim 20, wherein said expected phase of said post-zero-crossing pilot signal phase sample is calculated based on consecutive pilot signal phase samples and said predetermined phase sample interval.

22. The FM receiver of claim 21, wherein said adjusted post-zero-crossing sub-carrier signal phase sample is calculated based on said expected phase of said post-zero-crossing pilot signal sample, an adaptation value, and a pre-zero-crossing sub-carrier signal phase sample, wherein said pre-zero-crossing sub-carrier signal phase sample is a last sub-carrier signal phase sample obtained before said detected pilot signal zero-crossing, and wherein said adaptation value is variable during said calculation of said adjusted post-zero-crossing sub-carrier signal phase sample.

23. The FM receiver of claim 22, wherein said adjusted post-zero-crossing sub-carrier signal phase sample is a sum of an unadjusted first post-zero-crossing sub-carrier signal phase sample and a product of said adaptation value multiplied by a difference of said expected phase of said post-zero-crossing pilot signal phase sample and said unadjusted first post-zero-crossing sub-carrier signal phase sample.

24. A method for generating a synchronized sub-carrier signal based on a pilot signal, comprising:
responsive to a first pilot signal zero-crossing from a zero-crossing detector, generating a sequence of sub-carrier signal phase samples at a sampling frequency, said sequence of sub-carrier signal phase samples including a first sub-carrier signal phase sample and additional sub-carrier signal phase samples at predetermined phase sample intervals;
incrementing a phase sample count for each of said generated sub-carrier signal phase samples;
generating a sub-carrier signal based on each of said generated sub-carrier signal phase samples;
detecting if an expected or premature pilot signal zero-crossing occurs;
if said expected or premature pilot signal zero-crossing is not detected, repeating said generating, incrementing, and generating steps; and
if said expected or premature pilot signal zero-crossing is detected, adjusting a first post-zero-crossing sub-carrier signal phase sample.

25. The method of claim 24, wherein sub-carrier signal has a first frequency and said pilot signal has a second frequency, said first frequency being a multiple of said second frequency.

26. The method of claim 25, wherein said first frequency is twice said second frequency.

27. The method of claim 25, wherein said predetermined phase sample interval is proportional to a ratio of said first frequency to said sampling frequency.

28. The method of claim 24, wherein said first and expected pilot signal zero-crossings are detected by monitoring consecutive pilot signal samples for a change in signs of values of a first consecutive pilot signal sample and a second consecutive pilot signal sample.

29. The method of claim 28, wherein said first sub-carrier signal phase sample is generated in response to said first pilot signal zero-crossing.

30. The method of claim 24, wherein said premature pilot signal zero-crossing occurs if said phase sample count is less than a quotient of said sampling frequency divided by said first frequency.

31. The method of claim 30, further comprising:
responsive to said expected or premature pilot signal zero-crossing, ceasing generation of said sequence of sub-carrier signal phase samples;
restarting said sequence by re-generating said first sub-carrier signal phase sample; and
resetting said phase sample count to zero.

32. The method of claim 24, wherein said adjusted post-zero-crossing sub-carrier signal phase sample is calculated based on an approximated phase of said post-zero-crossing pilot signal phase sample, an adaptation value, and a pre-zero-crossing sub-carrier signal phase sample, wherein said pre-zero-crossing sub-carrier signal phase sample is a last sub-carrier signal phase sample obtained before said detected pilot signal zero-crossing, and wherein said approximated phase of said post-zero-crossing pilot signal phase sample is calculated based on said consecutive pilot signal samples and said predetermined phase sample interval.

33. The method of claim 32, wherein said first post-zero-crossing sub-carrier signal phase sample is adjusted using a sum of an unadjusted first post-zero-crossing sub-carrier signal phase sample and a product of said adaptation value multiplied by a difference of said approximated phase of said post-zero-crossing pilot signal phase sample and said unadjusted first post-zero-crossing sub-carrier signal phase sample, said adaptation value being variable during said adjusting.

34. An apparatus to generate a synchronized sub-carrier signal based on a pilot signal, the apparatus comprising:
detecting means, responsive to said pilot signal, for detecting a pilot signal zero-crossing based on said pilot signal;
sampling means, responsive to said detecting means, for generating a sequence of sub-carrier signal phase samples at a sampling frequency, said sequence of sub-carrier signal phase samples comprising a first sub-carrier signal phase sample and additional sub-carrier signal phase samples at predetermined phase sample intervals;
counting means for counting said phase samples generated by said sampling means;
signal generating means, responsive to said sequence of sub-carrier signal phase samples, for generating said synchronized sub-carrier signal; and phase computing means, responsive to said detecting means, said sampling means, and said counting means, for outputting to said sampling means an expected phase of a post-zero-crossing pilot signal phase sample in response to a premature pilot signal zero-crossing, and an adjusted post-zero-crossing sub-carrier signal phase sample in responsive to said detected pilot signal zero-crossing.

35. The apparatus of claim 34, wherein said sampling means comprises:
    means for storing said sub-carrier signal phase sample;
    means for adding a predetermined phase sample interval to said sub-carrier signal phase sample to generate a sequential sub-carrier signal phase sample; and
    means for selecting said sequential sub-carrier signal phase sample or said expected phase of said post-zero-crossing pilot signal phase sample based on a first enable signal output from said detecting means.

36. The apparatus of claim 34, wherein said phase computing means comprises:
    means for calculating said expected phase of said post-zero-crossing pilot signal phase sample;
    a plurality of adding means and a multiplying means for operating on said sub-carrier signal phase sample, said expected phase of said post-zero-crossing pilot signal sample, and an adaptation value to generate said adjusted post-zero-crossing sub-carrier signal phase sample;
    means for comparing said phase sample count to a predetermined threshold; and
    means for selecting either said expected chase of said post-zero-crossing pilot signal phase sample or said adjusted post-zero-crossing sub-carrier signal phase sample based on said means for comparing output.

37. The apparatus of claim 34, wherein said sub-carrier has a first frequency and said pilot signal has a second frequency, said first frequency being a multiple of said second frequency.

38. The apparatus of claim 37, wherein said first frequency is twice said second frequency.

39. The apparatus of claim 37, wherein said premature pilot signal zero-crossing occurs if said phase sample count is less than a quotient of said sampling frequency divided by said first frequency.

40. The apparatus of claim 39, wherein responsive to said detected pilot signal zero-crossing or said premature pilot signal zero-crossing, said sampling means ceases generating said sequence of sub-carrier signal phase samples and restarts said sequence by re-generating said first sub-carrier signal phase sample, and said counting means resets said phase sample count to zero.

41. The apparatus of claim 37, wherein said predetermined phase sample interval is proportional to a ratio of said first frequency to said sampling frequency.

42. The apparatus of claim 34, wherein said detecting means detects said pilot signal zero-crossing by monitoring consecutive pilot signal phase samples for a change in signs of values of a first consecutive pilot signal phase sample and a second consecutive pilot signal phase sample.

43. The apparatus of claim 34, wherein if no pilot signal zero-crossing is detected, said detecting means enables said sampling means and said counting means, and wherein responsive to said detected pilot signal zero-crossing, said detecting means enables said sampling means, said counting means, and said phase computing means.

44. The apparatus of claim 34, wherein said synchronized sub-carrier signal and said pilot signal are sinusoidal.

45. The apparatus of claim 34, wherein said expected phase of said post-zero-crossing pilot signal phase sample is calculated based on consecutive pilot signal phase samples and said predetermined phase sample interval.

46. The apparatus of claim 45, wherein said adjusted post-zero-crossing sub-carrier signal phase sample is calculated based on said expected phase of said post-zero-crossing pilot signal sample, an adaptation value, and a pre-zero-crossing sub-carrier signal phase sample, wherein said pre-zero-crossing sub-carrier signal phase sample is a last sub-carrier signal phase sample obtained before said detected pilot signal zero-crossing, and wherein said adaptation value is variable during said calculation of said adjusted post-zero-crossing sub-carrier signal phase sample.

47. The apparatus of claim 46, wherein said adjusted post-zero-crossing sub-carrier signal phase sample is a sum of an unadjusted first post-zero-crossing sub-carrier signal phase sample and a product of said adaptation value multiplied by a difference of said expected phase of said post-zero-crossing pilot signal phase sample and said unadjusted first post-zero-crossing sub-carrier signal phase sample.

* * * * *